United States Patent
Lin et al.

(10) Patent No.: US 9,653,178 B2
(45) Date of Patent: May 16, 2017

(54) MAGNETIC TRACK STORAGE UNIT, MEMORY, AND METHOD FOR CONTROLLING MAGNETIC TRACK STORAGE UNIT

(71) Applicant: Huawei Technologies Co., Ltd., Shenzhen (CN)

(72) Inventors: Yinyin Lin, Shanghai (CN); Zhulin Wei, Shenzhen (CN); Junfeng Zhao, Shenzhen (CN); Wei Yang, Hangzhou (CN); Yarong Fu, Shanghai (CN); Kai Yang, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 15/133,452

(22) Filed: Apr. 20, 2016

(65) Prior Publication Data
US 2016/0232984 A1    Aug. 11, 2016

Related U.S. Application Data

(63) Continuation of application No. PCT/CN2014/089044, filed on Oct. 21, 2014.

(30) Foreign Application Priority Data

Oct. 21, 2013    (CN) .......................... 2013 1 0496705

(51) Int. Cl.
G11C 11/15      (2006.01)
G11C 19/08      (2006.01)

(52) U.S. Cl.
CPC .......... *G11C 19/0841* (2013.01); *G11C 11/15* (2013.01); *G11C 19/0808* (2013.01)

(58) Field of Classification Search
CPC ..................................................... G11C 11/15
USPC ........................................................ 365/173
See application file for complete search history.

(56) References Cited

U.S. PATENT DOCUMENTS

| | | |
|---|---|---|
| 7,551,469 B1 | 6/2009 | Parkin |
| 7,626,844 B1 | 12/2009 | Moriya et al. |
| 8,559,279 B2 | 10/2013 | Lee et al. |
| 2008/0068880 A1 | 3/2008 | Lim et al. |
| 2008/0080092 A1 | 4/2008 | Kim |

(Continued)

FOREIGN PATENT DOCUMENTS

| | | |
|---|---|---|
| CN | 101145571 A | 3/2008 |
| CN | 101154436 A | 4/2008 |

(Continued)

OTHER PUBLICATIONS

Parkin, S., et al., "Magnetic Domain—Wall Racetrack Memory," ResearchGate May 2008, 7 pages.

(Continued)

*Primary Examiner* — Hoai V Ho
(74) *Attorney, Agent, or Firm* — Conley Rose, P.C.

(57) ABSTRACT

A storage device, a memory, and a method for controlling a storage device, where the storage device includes a comb-shaped magnetic track, a first drive circuit, a second drive circuit, a first drive port, and a second drive port, where the comb-shaped magnetic track includes a first storage area, a second storage area, and a comb handle, and the first storage area and the second storage area include more than two memory bars.

14 Claims, 3 Drawing Sheets

(56) References Cited

U.S. PATENT DOCUMENTS

| | | | |
|---|---|---|---|
| 2008/0152794 A1* | 6/2008 | Lim | G11C 19/0808 427/131 |
| 2009/0097365 A1* | 4/2009 | Lee | G11B 5/64 369/13.35 |
| 2010/0008135 A1 | 1/2010 | Cho et al. | |
| 2010/0232055 A1* | 9/2010 | Lee | G11B 5/581 360/77.01 |

FOREIGN PATENT DOCUMENTS

| | | |
|---|---|---|
| CN | 101188271 A | 5/2008 |
| CN | 101635166 A | 1/2010 |

OTHER PUBLICATIONS

Foreign Communication From a Counterpart Application, European Application No. 14856459.4, Extended European Search Report dated Sep. 21, 2016, 11 pages.

Foreign Communication From a Counterpart Application, PCT Application No. PCT/CN2014/089044, English Translation of International Search Report dated Jan. 27, 2015, 2 pages.

Foreign Communication From a Counterpart Application, PCT Application No. PCT/CN2014/089044, English Translation of Written Opinion dated Jan. 27, 2015, 6 pages.

\* cited by examiner

By controlling input voltages of a first port, a second port, a first drive port, and a second drive port that are of a storage unit and driving a first drive circuit, control to generate a current pulse in a memory bar in a first storage area of the storage unit, and drive a magnetic domain wall in the memory bar in which the current pulse is generated to move — 101

By controlling the input voltages of the first port, the second port, the first drive port, and the second drive port and driving a second drive circuit, control to generate a current pulse in a memory bar in a second first storage area of the storage unit, and drive a magnetic domain wall in the memory bar in which the current pulse is generated to move — 102

FIG. 4

MAGNETIC TRACK STORAGE UNIT, MEMORY, AND METHOD FOR CONTROLLING MAGNETIC TRACK STORAGE UNIT

CROSS-REFERENCE TO RELATED APPLICATIONS

This application is a continuation of International Application No. PCT/CN2014/089044, filed on Oct. 21, 2014, which claims priority to Chinese Patent Application No. 201310496705.2, filed on Oct. 21, 2013, both of which are hereby incorporated by reference in their entireties.

TECHNICAL FIELD

The present disclosure relates to the field of data storage technologies, and in particular, to a storage unit, a memory, and a method for controlling a storage unit.

BACKGROUND

Generally, there are two data storage manners, flash memory storage and hard disk storage. A flash memory has a high access speed, a small capacity, and a high price. A hard disk has a low access speed, but has a large capacity and a low price. Based on this, at present, there exists a new storage manner, that is, a nanowire track racetrack memory, which has features including high performance of a flash memory and a low cost and a high capacity of a hard disk at the same time.

An existing nanowire track is made of magnetic materials and includes multiple magnetic areas, that is, magnetic domains, where neighboring magnetic domains are separated by a magnetic domain wall, and the multiple magnetic areas and the magnetic domain walls form a U-shaped storage track. A high-voltage drive circuit is disposed at two ends of the top of the track, to generate a current pulse that drives the magnetic domain walls to move, and the magnetic domain walls move along the track under an action of the current pulse such that the magnetic domains move. A pair of write and read apparatuses is disposed at the bottom of the track in order to perform read and write control on the U-shaped storage track.

If a U-shaped nanowire track includes 2N magnetic domains (N is a positive integer greater than or equal to 1), when the magnetic domain wall moves, a right track needs to accommodate data information of a left track, and therefore, the 2N magnetic domains may store only N-bit data, and storage density is low, to drive 2N magnetic domain walls to move along the magnetic track, a voltage applied to the high-voltage drive circuit at the two ends of the top of the track is high, and therefore power consumption of a memory is large. In addition, a pair of read and write apparatuses controls only two memory bars in the magnetic track, and therefore production costs are relatively high.

SUMMARY

Embodiments of the present disclosure provide a storage unit, a memory, and a method for controlling a storage unit, to increase storage density, and reduce power consumption and production costs. The storage unit is also referred to as a storage device.

A first aspect of the present disclosure provides a storage unit, where the storage unit may include a comb-shaped magnetic track, a first drive circuit, a second drive circuit, a first drive port connected to the first drive circuit, and a second drive port connected to the second drive circuit, where the comb-shaped magnetic track includes a first storage area, a second storage area, and a comb handle connected to the first storage area and the second storage area, and at least one storage area of the first storage area and the second storage area includes at least two memory bars, the first drive circuit is configured to drive the first storage area, and the second drive circuit is configured to drive the second storage area, by controlling input voltages of a first port, a second port, the first drive port, and the second drive port and driving the first drive circuit, a current pulse is generated in a memory bar in the first storage area, and a magnetic domain wall in the memory bar in which the current pulse is generated is driven to move; and by controlling the input voltages of the first port, the second port, the first drive port, and the second drive port and driving the second drive circuit, a current pulse is generated in a memory bar in the second storage area, and a magnetic domain wall in the memory bar in which the current pulse is generated is driven to move.

In a first possible implementation manner of the first aspect, the first drive circuit includes a first gate port, and the second drive circuit includes a second gate port, where the first gate port is configured to control, according to a value of a voltage applied to the first gate port, to switch on or off the first drive circuit, and the second gate port is configured to control, according to a value of a voltage applied to the second gate port, to switch on or off the second drive circuit.

In a second possible implementation manner of the first aspect, the first storage area is disposed between the first port and the comb handle, and the second storage area is disposed between the second port and the comb handle.

With reference to the first aspect, or the first possible implementation manner or the second possible implementation manner of the first aspect, in a third possible implementation manner, the storage unit further includes a write circuit and a read circuit that are disposed at the bottom of the comb-shaped magnetic track, where the write circuit is configured to perform a write operation on a memory bar in the first storage area or in the second storage area, and the read circuit is configured to perform a read operation on a memory bar in the first storage area or the second storage area.

With reference to the third possible implementation manner of the first aspect, in a fourth possible implementation manner, the storage unit further includes a storage module connected to the read circuit, where the storage module is configured to, when a magnetic domain wall in any memory bar in the comb-shaped magnetic track moves, store data that read out from the comb-shaped magnetic track.

A second aspect of the present disclosure provides a memory, where the memory may include at least one storage unit.

The storage unit may include a comb-shaped magnetic track, a first drive circuit, a second drive circuit, a first drive port connected to the first drive circuit, and a second drive port connected to the second drive circuit, where the comb-shaped magnetic track includes a first storage area, a second storage area, and a comb handle connected to the first storage area and the second storage area, and at least one storage area of the first storage area and the second storage area includes at least two memory bars, the first drive circuit is configured to drive the first storage area, and the second drive circuit is configured to drive the second storage area, by controlling input voltages of a first port, a second port, the first drive port, and the second drive port and driving the first drive circuit, a current pulse is generated in a memory bar in the first storage area, and a magnetic domain wall in the memory bar in which the current pulse is generated is driven to move, and by controlling the input voltages of the first port, the second port, the first drive port, and the second drive port and driving the second drive circuit, a current pulse is generated in a memory bar in the second storage area, and a magnetic domain wall in the memory bar in which the current pulse is generated is driven to move.

With reference to the second aspect, in a first possible implementation manner, the first drive circuit includes a first gate port, and the second drive circuit includes a second gate port, where the first gate port is configured to control, according to a value of a voltage applied to the first gate port, to switch on or off the first drive circuit, and the second gate port is configured to control, according to a value of a voltage applied to the second gate port, to switch on or off the second drive circuit.

In a second possible implementation manner of the second aspect, the first storage area is disposed between the first port and the comb handle, and the second storage area is disposed between the second port and the comb handle.

With reference to the second aspect, or the first possible implementation manner or the second possible implementation manner of the second aspect, in a third possible implementation manner, the storage unit further includes a write circuit and a read circuit that are disposed at the bottom of the comb-shaped magnetic track, where the write circuit is configured to perform a write operation on a memory bar in the first storage area or the second storage area, and the read circuit is configured to perform a read operation on a memory bar in the first storage area or the second storage area.

With reference to the third possible implementation manner of the second aspect, in a fourth possible implementation manner, the storage unit further includes a storage module connected to the read circuit, where the storage module is configured to when a magnetic domain wall in any memory bar in the comb-shaped magnetic track moves, store data that read out from the comb-shaped magnetic track.

A third aspect of the present disclosure provides a method for controlling a storage unit, where the method is applied to the foregoing storage unit and the method may include, by controlling input voltages of a first port, a second port, a first drive port, and a second drive port that are of the storage unit and driving a first drive circuit, controlling to generate a current pulse in a memory bar in a first storage area of the storage unit, and driving a magnetic domain wall in the memory bar in which the current pulse is generated to move, and by controlling the input voltages of the first port, the second port, the first drive port, and the second drive port and driving a second drive circuit, controlling to generate a current pulse in a memory bar in a second storage area of the storage unit, and driving a magnetic domain wall in the memory bar in which the current pulse is generated to move.

With reference to the third aspect, in a first possible implementation manner, the method further includes connecting the first drive circuit or connecting the second drive circuit according to values of input voltages of a first gate port and a second gate port that are of the storage unit.

It may be seen from the foregoing technical solutions that, the storage unit, the memory, and the method for controlling a storage unit that are provided in the embodiments of the present disclosure have the following advantages, the storage unit includes more than two memory bars, which are used for storing data, and therefore increases storage density. In addition, compared with a method for controlling two memory bars using one pair of read and write apparatuses, a method for controlling more than two memory bars using one pair of read and write apparatuses reduces manufacturing costs. In addition, a current pulse provide by a drive circuit in the storage unit needs to drive only a magnetic domain wall in a memory bar on one side of a track to move, and therefore, a drive voltage may be reduced and power consumption may also be reduced.

BRIEF DESCRIPTION OF DRAWINGS

To describe the technical solutions in the embodiments of the present disclosure more clearly, the following briefly introduces the accompanying drawings required for describing the embodiments. The accompanying drawings in the following description show merely some embodiments of the present disclosure, and a person of ordinary skill in the art may still derive other drawings from these accompanying drawings without creative efforts.

DESCRIPTION OF EMBODIMENTS

To make the disclosure objectives, features, and advantages of the present disclosure clearer and more comprehensible, the following clearly and describes the technical solutions in the embodiments of the present disclosure with reference to the accompanying drawings in the embodiments of the present disclosure. The embodiments described in the following are merely some but not all of the embodiments of the present disclosure. All other embodiments obtained by a person of ordinary skill in the art based on the embodiments of the present disclosure without creative efforts shall fall in the protection scope of the present disclosure.

In the specification, claims, and accompanying drawings of the present disclosure, the terms "first", "second", "third", "fourth", and so on (if existent) are intended to distinguish between similar objects but do not necessarily indicate a specific order or sequence. It should be understood that the data termed in such a way are interchangeable in proper circumstances so that the embodiments of the present disclosure described herein may, for example, be implemented in orders except the order illustrated or described herein. Moreover, the terms "include", "contain" and any other variants mean to cover the non-exclusive inclusion, for example, a process, method, system, product, or device that includes a list of steps or units is not necessarily limited to those steps or units, but may include other steps or units not expressly listed or inherent to such a process, method, system, product, or device.

Detailed descriptions are provided separately in the following using specific embodiments.

Figure 1:
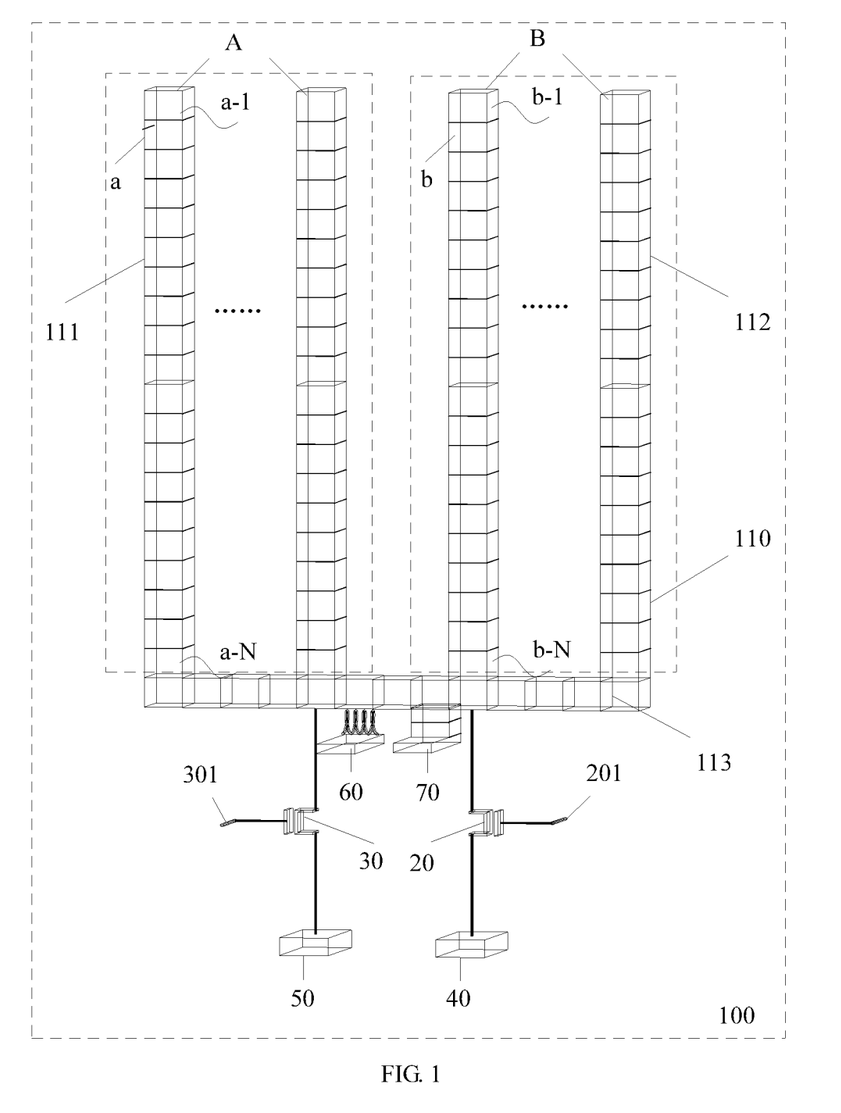
FIG. 1 is a schematic structural diagram of a storage unit according to an embodiment of the present disclosure.

Referring to FIG. 1, FIG. 1 is a schematic structural diagram of a storage unit 100 according to an embodiment of the present disclosure, and the storage unit 100 includes a comb-shaped magnetic track 110, a first drive circuit 20, a second drive circuit 30, a first drive port 40 connected to the first drive circuit 20, and a second drive port 50 connected to the second drive circuit 30.

The comb-shaped magnetic track 110 includes a first storage area 111, a second storage area 112, and a comb handle 113 connected to the first storage area 111 and the second storage area 112, and at least one storage area of the first storage area 111 and the second storage area 112 includes at least two memory bars (a, b, . . . shown in the figure).

Further, the first storage area 111 is disposed between a first port A and the comb handle 113, and the second storage area 112 is disposed between a second port B and the comb handle 113. The storage unit shown in FIG. 1 is used as an example. Memory bars in the first storage area 111 and the second storage area 112 may all include N (N is a positive integer greater than or equal to 1) memory blocks, where a-1 shown in the figure is a first magnetic storage area block of a memory bar a, b-1 shown in the figure is a first magnetic storage area block of a memory bar b, a-N shown in the figure is a last magnetic storage area block of the memory bar a, and b-N shown in the figure is a last magnetic storage area block of the memory bar b. In addition, it is easily figured out that in this embodiment of the present disclosure, the schematic structural diagram of the storage unit shown in FIG. 1 is merely used for analysis and description, which does not constitute a limitation on the present disclosure.

In this embodiment of the present disclosure, because at least one storage area of the first storage area 111 and the second storage area 112 includes at least two memory bars, the first port A on the top of the comb-shaped magnetic track 110 consists of a top port of one or at least two memory bars included in the first storage area 111, and the second port B on the top of the comb-shaped magnetic track 110 consists of a top port of one or at least two memory bars included in the second storage area 112.

It may be understood that both the first drive circuit 20 and the second drive circuit 30 may be designed as a transistor of a metal-oxide semiconductor (MOS) structure or a transistor of a complementary metal-oxide semiconductor (CMOS) structure or a drive circuit consisting of the transistor, which is not limited herein.

The first drive circuit 20 is configured to drive the first storage area 111, and the second drive circuit 30 is configured to drive the second storage area 112.

By controlling input voltages of the first port A, the second port B, the first drive port 40, and the second drive port 50 and driving the first drive circuit 20, a current pulse is generated in a memory bar in the first storage area 111, and a magnetic domain wall in the memory bar in which the current pulse is generated is driven to move.

When the first drive circuit 20 is driven, and a current pulse is generated in the first storage area 111, a magnetic domain wall in the first storage area 111 is driven to move. In addition, to save energy and ensure that the first storage area 111 works properly, the second drive circuit 30 is disconnected, that is, the second drive circuit 30 does not work.

By controlling the input voltages of the first port A, the second port B, the first drive port 40, and the second drive port 50 and driving the second drive circuit 30, a current pulse is generated in a memory bar in the second storage area 112, and a magnetic domain wall in the memory bar in which the current pulse is generated is driven to move.

When the second drive circuit 30 is driven, and a current pulse is generated in the second storage area 112, a magnetic domain wall in the second storage area 112 is driven to move. In addition, to save energy and ensure that the second storage area 112 works properly, the first drive circuit 20 is disconnected, that is, the first drive circuit 20 does not work.

It may be known from the foregoing that, the storage unit 100 provided in this embodiment of the present disclosure includes more than two memory bars, which are used for storing data, and therefore increases storage density. In addition, compared with a method for controlling two memory bars using one pair of read and write apparatuses, a method of controlling more than two memory bars using one pair of read and write apparatuses reduces manufacturing costs. In addition, a current pulse provided by a drive circuit in the storage unit 100 needs to drive only a magnetic domain wall in a memory bar on one side of a track to move, and therefore, a drive voltage may be reduced and power consumption may also be reduced.

Further, as shown in FIG. 1, the first drive circuit 20 includes a first gate port 201, and the second drive circuit 30 includes a second gate port 301, where the first gate port 201 is configured to control, according to a value of a voltage applied to the first gate port 201, to switch on or off the first drive circuit 20, and the second gate port 301 is configured to control, according to a value of a voltage applied to the second gate port 301, to switch on or off the second drive circuit 30.

It should be noted that, for the first storage area 111, if, by controlling the input voltages of the first port A, the second port B, the first drive port 40, and the second drive port 50, a voltage difference between two ends (that is, the first drive port 40, and a top port that corresponds to a memory bar) of a memory bar (for example, the memory bar a) in the first storage area 111 is greater than or equal to a voltage threshold for driving a magnetic domain wall to move, a voltage difference between two ends (that is, the first drive port 40, and a top port that corresponds to a memory bar) of another memory bar in the first storage area 111 is less than the voltage threshold for driving a magnetic domain wall to move, and a voltage difference between two ends (that is, the second drive port 50, and a top port that corresponds to a memory bar) of all memory bars in the second storage area 112 is less than the voltage threshold for driving a magnetic domain wall to move, and in addition, a value of a voltage of the first gate port 201 is controlled to connect the first drive circuit 20 and a value of a voltage of the second gate port 301 is controlled to disconnect the second drive circuit 30, then under driving of the first drive circuit 20, a current pulse is generated in the memory bar a in the first storage area 111, and a magnetic domain wall in the memory bar a is driven to move, thereby completing a read operation or a write operation on the memory bar a. In addition, it is easily figured out that a voltage at two ends of the memory bar a in the storage unit 100 is proportional to a moving distance of a magnetic domain wall, that is, when a moving distance becomes longer, to maintain a same moving speed of a magnetic domain wall, it is required to increase the voltage at the two ends of the corresponding memory bar a.

In this embodiment of the present disclosure, a voltage of each port of the storage unit 100 is controlled, so that a memory bar in the first storage area 111 and a memory bar in the second storage area 112 do not work at the same time, that is, a read operation or a write operation is controlled to be performed on only one memory bar each time.

It may be understood that, for a control operation on another memory bar in the first storage area 111 and a memory bar in the second storage area 112, reference may be made to a control process of the foregoing first storage area 111, and details are not described herein again.

Still further, the storage unit 100 further includes a write circuit 60 and a read circuit 70 that are disposed at the bottom of the comb-shaped magnetic track 110, where the write circuit 60 is configured to perform a write operation on a memory bar in the first storage area 111 and a memory bar in the second storage area 112, and the read circuit 70 is configured to perform a read operation on a memory bar in the first storage area 111 and a memory bar in the second storage area 112.

It should be noted that, a storage principle of a memory bar in the comb-shaped magnetic track 110 is that information is stored by moving a magnetic domain wall. Preferably, because the first drive circuit 20 and the second drive circuit 30 are disposed at the bottom of the comb-shaped magnetic track 110 to respectively drive a magnetic domain wall of a memory bar in the first storage area 111 and a magnetic domain wall of a memory bar in the second storage area 112 to move, M*N magnetic domains in M (M is a positive integer greater than or equal to 2) memory bars may store M*N-bit data, which increases storage density.

The storage unit 100 further includes a storage module connected to the read circuit 70, where the storage module is configured to, when a magnetic domain wall in any memory bar in the comb-shaped magnetic track 110 moves, store data that read out from the comb-shaped magnetic track 110.

Figure 2:
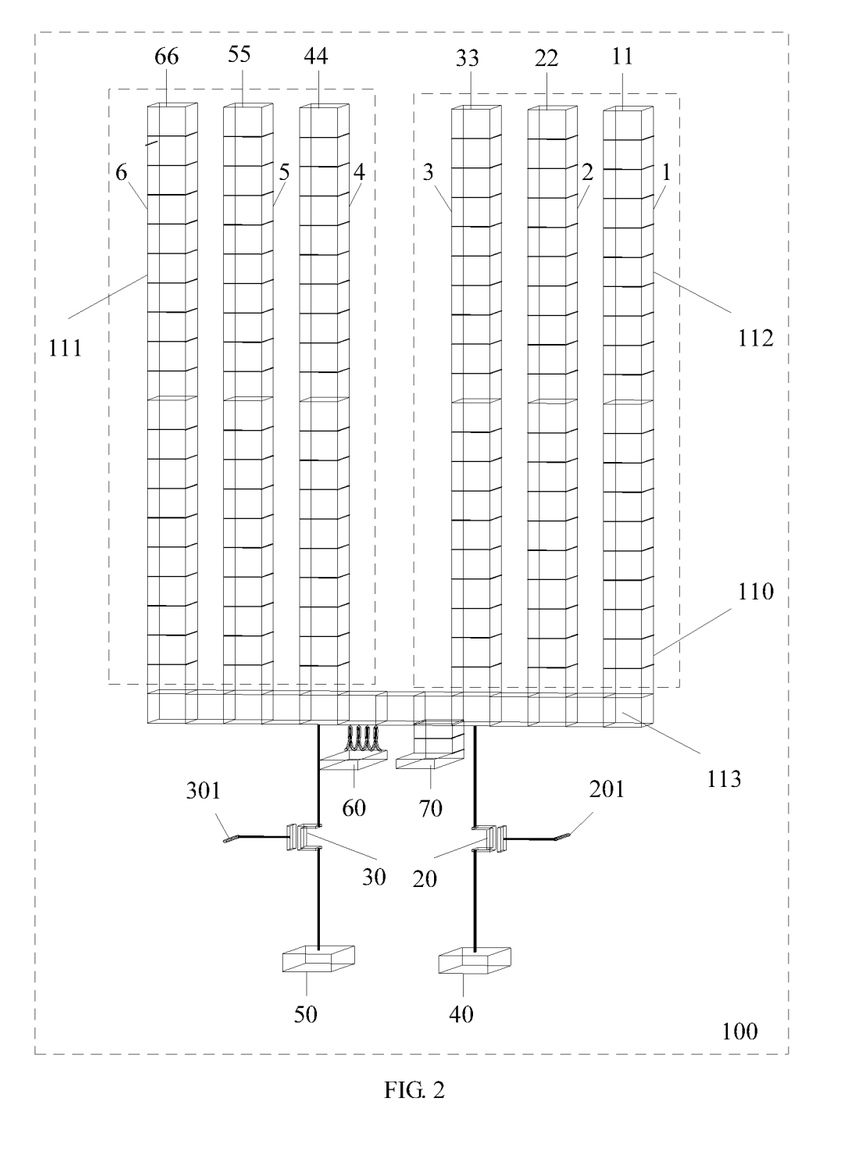
FIG. 2 is another schematic structural diagram of a storage unit according to an embodiment of the present disclosure.

As shown in FIG. 2, correspondingly, the first port A consists of a port 44, a port 55, and a port 66, and the second port B consists of a port 11, a port 22, and a port 33. In addition, it is easily figured out that the first storage area 111 and the second storage area 112 may also consist of two, four, or more memory bars, and a quantity of memory bars of the first storage area 111 may be different from that of the second storage area 112. Herein, the example does not constitute a limitation on the present disclosure.

For MOS transistors in the first drive circuit 20 and the second drive circuit 30, enhanced N transistors are used as an example. Referring to Table 1, if a write operation is performed on the memory bar 1, a voltage Vpp is applied to the port 11, a voltage V-inhibit is applied to ports 22 to 66, a voltage Vss is applied to the first gate port 201, and the second gate port 301, the second drive port 50, and the first drive port 40 are all grounded, where a value of Vss is greater than a voltage threshold Vt1 of the N transistors, and the voltage Vss is applied to the first gate port 201 and the second gate port 301, so that the MOS transistors in the drive circuits are conducted. A spin-transfer voltage threshold of a memory bar is defined as Vt2, and a value of Vpp is greater than or equal to Vt2, that is, Vpp may enable a current pulse to be generated in the memory bar, and the voltage V-inhibit is less than Vt2, and a value of Vpp−(V-inhibit) is less than Vt2.

TABLE 1

| | 11 | 22 | 33 | 44 | 55 | 66 | 301 | 201 | 40, 50 |
|---|---|---|---|---|---|---|---|---|---|
| 1 | Vpp | V-inhibit | V-inhibit | V-inhibit | V-inhibit | V-inhibit | Vss | GND | GND |
| 2 | V-inhibit | Vpp | V-inhibit | V-inhibit | V-inhibit | V-inhibit | Vss | GND | GND |
| 3 | V-inhibit | V-inhibit | Vpp | V-inhibit | V-inhibit | V-inhibit | Vss | GND | GND |
| 4 | V-inhibit | V-inhibit | V-inhibit | Vpp | V-inhibit | V-inhibit | GND | Vss | GND |
| 5 | V-inhibit | V-inhibit | V-inhibit | V-inhibit | Vpp | V-inhibit | GND | Vss | GND |
| 6 | V-inhibit | V-inhibit | V-inhibit | V-inhibit | V-inhibit | Vpp | GND | Vss | GND |

In this embodiment of the present disclosure, for a better understanding of the technical solution of the present disclosure, the following provides a specific application scenario to analyze and describe an operating principle of the storage unit 100.

In the application scenario, by controlling input voltages of the first port A, the second port B, the first drive port 40, and the second drive port 50 and driving a MOS drive circuit (the first drive circuit 20 or the second drive circuit 30), a current pulse may be generated in the comb-shaped magnetic track 110 (a memory bar in the first storage area 111 or a memory bar in the second storage area 112), and a magnetic domain wall is driven to move. Data writing is performed using the write circuit 60 at the bottom of the track, and data reading is performed using the read circuit 70 at the bottom of the track.

Furthermore, reference may be made to FIG. 2, FIG. 2 is a schematic structural diagram of the storage unit 100 provided in the application scenario. Reference may also be made to Table 1 and Table 2, where Table 1 describes port voltage control performed when the storage unit 100 performs a write operation, and Table 2 describes port voltage control performed when the storage unit 100 performs a read operation.

In the application scenario, it is assumed that the first storage area 111 consists of three memory bars, that is, a memory bar 4, a memory bar 5, and a memory bar 6, and the second storage area 112 consists of three memory bars, that is, a memory bar 1, a memory bar 2, and a memory bar 3.

Referring to Table 1, control of a write operation is performed on the memory bar 1. The voltage Vss is applied to the second gate port 301, so that a left MOS transistor may be gated (that is, a MOS transistor in the second drive circuit 30 is gated), and the first gate port 201 is grounded, so that a right MOS transistor is disconnected (that is, a MOS transistor in the first drive circuit 20 is disconnected), the voltage Vpp is applied to the port 11 corresponding to the memory bar 1, and the second drive port 50 is grounded, a voltage at two ends of the memory bar 1 is Vpp, which is greater than the spin-transfer voltage threshold Vt2, and under driving of the second drive circuit 30, a current pulse is generated in the memory bar 1, and a magnetic domain wall in the memory bar 1 moves. Because a moving direction of the magnetic domain wall is opposite to a direction of a current, a magnetic domain wall in the memory bar 1 is driven to move from the write circuit 60 and the read circuit 70 to the port 11 in order to implement a write operation. A voltage V-inhibit is applied to the ports 22 to 66, and a voltage at two ends of memory bars 2 to 6 is Vpp−(V-inhibit), which is less than the spin-transfer voltage threshold Vt2 and is not high enough to drive a magnetic domain wall to move. It may be understood that, a value of a voltage applied to the first drive port 40 does not affect an operation process because the right MOS transistor (that is, the MOS transistor in the first drive circuit 20) is disconnected. For ease of setting, the voltage of the first drive port 40 is set to be the same as a voltage of the second drive port 50 herein.

TABLE 2

| | 11 | 22 | 33 | 44 | 55 | 66 | 301 | 201 | 40, 50 |
|---|---|---|---|---|---|---|---|---|---|
| 1 | GND | V-inhibit | V-inhibit | V-inhibit | V-inhibit | V-inhibit | Vss | GND | Vpp |
| 2 | V-inhibit | GND | V-inhibit | V-inhibit | V-inhibit | V-inhibit | Vss | GND | Vpp |
| 3 | V-inhibit | V-inhibit | GND | V-inhibit | V-inhibit | V-inhibit | Vss | GND | Vpp |
| 4 | V-inhibit | V-inhibit | V-inhibit | GND | V-inhibit | V-inhibit | GND | Vss | Vpp |
| 5 | V-inhibit | V-inhibit | V-inhibit | V-inhibit | GND | V-inhibit | GND | Vss | Vpp |
| 6 | V-inhibit | V-inhibit | V-inhibit | V-inhibit | V-inhibit | GND | GND | Vss | Vpp |

Referring to Table 2, control of a read operation is performed on the memory bar 1. A voltage Vss is applied to the second gate port 301, so that the left MOS transistor may be gated (that is, the MOS transistor in the second drive circuit 30 is gated), and the first gate port 201 is grounded, so that the right MOS transistor is disconnected (that is, the MOS transistor in the first drive circuit 20 is disconnected), the port 11 corresponding to the memory bar 1 is grounded, and a voltage Vpp is applied to the second drive port 50, a voltage at two ends of the memory bar 1 is Vpp, which is greater than the spin-transfer voltage threshold Vt2, and under driving of the second drive circuit 30, a current pulse is generated in the memory bar 1, and a magnetic domain wall in the memory bar 1 moves. Because a moving direction of the magnetic domain wall is opposite to a direction of a current, a magnetic domain wall in the memory bar 1 is driven to move from the port 11 to the write circuit 60 and the read circuit 70 in order to implement a read operation. A voltage V-inhibit is applied to the ports 22 to 66, and a voltage at two ends of memory bars 2 to 6 is Vpp–(V-inhibit), which is less than the spin-transfer voltage threshold Vt2 and is not high enough to drive a magnetic domain wall to move. It may be understood that, a value of a voltage applied to the first drive port 40 does not affect an operation process because the right MOS transistor (that is, the MOS transistor in the first drive circuit 20) is disconnected. For ease of setting, the voltage of the first drive port 40 is set to be the same as a voltage of the first drive port 50 herein.

In addition, it is easily figured out that a read/write operation manner of another memory bar is also similar to a read/write operation manner of the memory bar 1, and details are not described herein again.

It should be noted that, a value of the voltage Vpp–(V-inhibit) is not high enough to generate a current pulse that enables a magnetic area to move, and the voltage Vpp is greater than the spin-transfer voltage threshold Vt2, and therefore, memory bars do not work at the same time by controlling a voltage of each port of the storage unit 100, that is, a read operation or a write operation is controlled to be performed on only one memory bar each time.

It may be understood that, operating principles of the write circuit 60 and the read circuit 70 that are of the storage unit 100 provided in this embodiment of the present disclosure are the same as that of read and write apparatuses that are of an existing magnetic track, and details are not described herein again. In addition, it is easily figured out that in this embodiment of the present disclosure, a structure of the storage unit shown in FIG. 2 and a read/write operation control process of the storage unit are used merely for analysis and description, which does not constitute a limitation on the present disclosure.

It may be known from the foregoing that, the storage unit 100 provided in this embodiment of the present disclosure includes more than two memory bars, which are used for storing data, and therefore increases storage density. In addition, compared with a method for controlling two memory bars using one pair of read and write apparatuses, a method for controlling more than two memory bars using one pair of read and write apparatuses reduces manufacturing costs. In addition, a current pulse provided by a drive circuit in the storage unit 100 needs to drive only a magnetic domain wall in a memory bar on one side of a track to move, and therefore, a drive voltage may be reduced and power consumption may also be reduced.

To better implement the storage unit 100 provided in this embodiment of the present disclosure, an embodiment of the present disclosure further provides a memory that is based on the foregoing storage unit 100 and a method for controlling the storage unit 100. Meanings of nouns are the same as those in the foregoing storage unit 100. For specific implementation details, reference may be made to descriptions in the foregoing embodiment.

Figure 3:
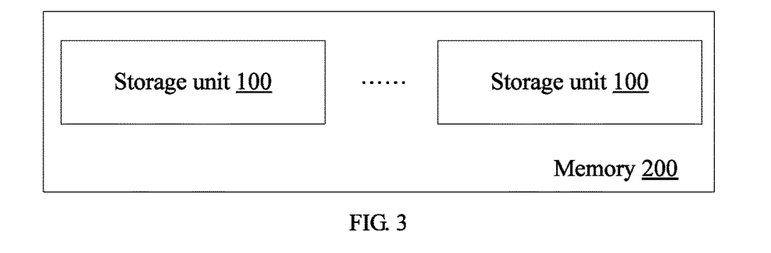
FIG. 3 is a schematic structural diagram of a memory according to an embodiment of the present disclosure.

Referring to FIG. 3, FIG. 3 is a schematic structural diagram of a memory 200 according to an embodiment of the present disclosure, where the memory 200 includes at least one storage unit 100 described above.

It may be understood that, specific structure setting and an operating principle that are of the storage unit 100 in the memory 200 may be further implemented according to related content of the foregoing embodiment, and details are not described herein again.

The memory 200 provided in this embodiment of the present disclosure includes the foregoing storage unit 100, and the storage unit 100 includes more than two memory bars, which are used to store data in order to increase storage density. In addition, compared with a method for controlling two memory bars using one pair of read and write apparatuses, a method for controlling more than two memory bars using one pair of read and write apparatuses reduces manufacturing costs. In addition, a current pulse provided by a drive circuit in the storage unit 100 only needs to drive a magnetic domain wall in a memory bar on one side of a track to move, and therefore, a drive voltage may be reduced and power consumption may also be reduced.

Figure 4:
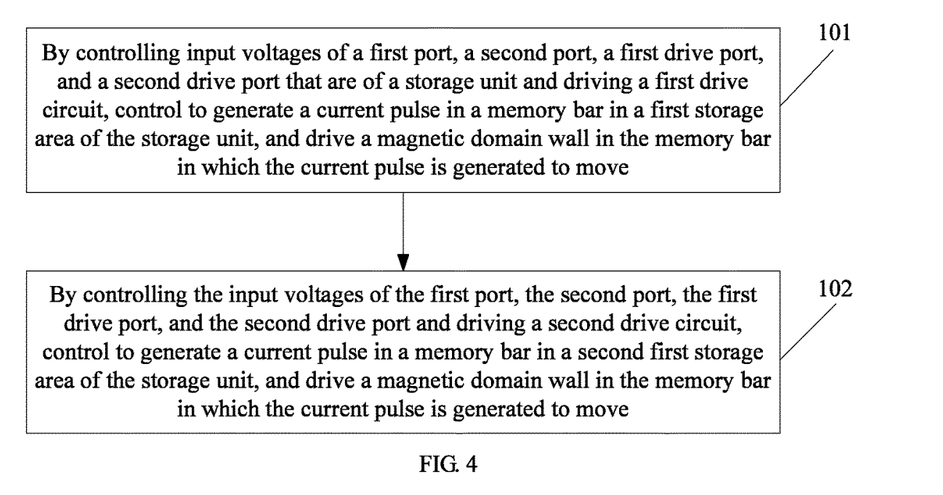
FIG. 4 is a schematic flowchart of a method for controlling a storage unit according to an embodiment of the present disclosure.

Referring to FIG. 4, FIG. 4 is a schematic flowchart of a method for controlling a storage unit 100 according to an embodiment of the present disclosure. The method is applied to the storage unit 100 provided in the foregoing embodiment, and reference may also be made to the schematic structural diagram of the storage unit 100 shown in FIG. 1 or FIG. 2. The method includes the following steps:

Step 101: By controlling input voltages of a first port A, a second port B, a first drive port 40, and a second drive port 50 that are of the storage unit 100 and driving a first drive circuit 20, control to generate a current pulse in a memory bar in a first storage area 111 of the storage unit 100, and drive a magnetic domain wall of the memory bar in which the current pulse is generated to move.

Step 102: By controlling the input voltages of the first port A, the second port B, the first drive port 40, and the second drive port 50 and driving a second drive circuit 30, control to generate a current pulse in a memory bar in a second storage area 112 of the storage unit 100, and drive a magnetic domain wall of the memory bar in which the current pulse is generated to move.

It may be understood that the storage unit 100 may include a comb-shaped magnetic track 110, the first drive circuit 20, the second drive circuit 30, the first drive port 40 connected to the first drive circuit 20, and the second drive port 50 connected to the second drive circuit 30, where the comb-shaped magnetic track 110 includes the first storage area 111, the second storage area 112, and a comb handle 113 connected to the first storage area 111 and the second storage area 112, the first storage area 111 is disposed between the first port A and the comb handle 113, the second storage area 112 is disposed between the second port B and the comb handle 113, and at least one storage area of the first storage area 111 and the second storage area 112 includes at least two memory bars. The first port A on the top of the comb-shaped magnetic track 110 consists of a top port of at least two memory bars included in the first storage area 111, and the second port B on the top of the comb-shaped magnetic track 110 consists of a top port of at least two memory bars included in the second storage area 112. For specific structure setting, reference may be made to FIG. 1 and related content in the foregoing embodiment.

Further, the first drive circuit 20 in the storage unit 100 includes a first gate port 201, and the second drive circuit 30 includes a second gate port 301. The control method may further include: connecting the first drive circuit 20 or connecting the second drive circuit 30 according to values of input voltages of the first gate port 201 and the second gate port 301 that are of the storage unit 100.

The storage unit 100 shown in FIG. 1 is used as an example. For the first storage area 111, if, by controlling the input voltages of the first port A, the second port B, the first drive port 40, and the second drive port 50, a voltage difference between two ends (that is, the first drive port 40, and a top port that corresponds to a memory bar) of a memory bar (for example, a memory bar a) in the first storage area 111 is greater than or equal to a voltage threshold for driving a magnetic domain wall to move, a voltage difference between two ends (that is, the first drive port 40, and a top port that corresponds to a memory bar) of another memory bar in the first storage area 111 is less than the voltage threshold for driving a magnetic domain wall to move, and a voltage difference between two ends (that is, the second drive port 50, and a top port that corresponds to a memory bar) of all memory bars in the second storage area 112 is less than the voltage threshold for driving a magnetic domain wall to move, and in addition, a value of a voltage of the first gate port 201 is controlled to connect the first drive circuit 20 and a value of a voltage of the second gate port 301 is controlled to disconnect the second drive circuit 30, then under driving of the first drive circuit 20, a current pulse is generated in the memory bar a in the first storage area 111, and a magnetic domain wall in the memory bar a is driven to move, thereby completing a read operation or a write operation on the memory bar a.

In this embodiment of the present disclosure, a voltage of each port of the storage unit 100 is controlled, so that a memory bar in the first storage area 111 and a memory bar in the second storage area 112 do not work at the same time, that is, a read operation or a write operation is controlled to be performed on only one memory bar each time.

It may be understood that, for a control operation on another memory bar in the first storage area 111 and a memory bar in the second storage area 112, reference may be made to a control process of the foregoing first storage area 111, and details are not described herein again.

Still further, the storage unit 100 further includes a write circuit 60 and a read circuit 70 that are disposed at the bottom of the comb-shaped magnetic track 110, and a storage module connected to the read circuit 70. Therefore, the method may further include performing, by the write circuit 60, a write operation on the first storage area 111 and the second storage area 112, and performing, by the read circuit 70, a read operation on the first storage area 111 and the second storage area 112, and when a magnetic domain wall in a memory bar (for example, a) in the first storage area 111 or in a memory bar (for example, b) in the second storage area 112 moves, storing, by the storage module, data that read out from the comb-shaped magnetic track 110.

It may be understood that, for a specific operating principle of the storage unit 100, reference may be made to Table 1 and specific implementation in the foregoing application scenario, and details are not described herein again.

It may be known from the foregoing that, the method for controlling a storage unit 100 according to this embodiment of the present disclosure is applied to the storage unit 100 described in the foregoing embodiment, and in the method, more than two memory bars in the storage unit 100 are controlled and may all be used for storing data, which increases storage density. In addition, compared with a method for controlling two memory bars using one pair of read and write apparatuses, a method for controlling more than two memory bars using only one pair of read and write apparatuses reduces manufacturing costs. In addition, in the method, a current pulse provided by a drive circuit in the storage unit 100 is further controlled and needs to drive only a magnetic domain wall in a memory bar on one side of a track to move, and therefore, a drive voltage may be reduced and power consumption may also be reduced.

It may be clearly understood by a person skilled in the art that, for the purpose of convenient and brief description, for a detailed working process of the foregoing system, apparatus, and unit, reference may be made to a corresponding process in the foregoing method embodiments, and details are not described herein again.

In the several embodiments provided in the present application, it should be understood that the disclosed system, apparatus, and method may be implemented in other manners. For example, the described apparatus embodiment is merely exemplary. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented using some interfaces. The indirect couplings or communication connections between the apparatuses or units may be implemented in electronic, mechanical, or other forms.

The units described as separate parts may or may not be physically separated, and parts displayed as units may or may not be physical units, may be located in one position, or may be distributed on a plurality of network units. Some or all of the units may be selected according to actual needs to achieve the objectives of the solutions of the embodiments.

In addition, functional units in the embodiments of the present disclosure may be integrated into one processing unit, or each of the units may exist alone physically, or two or more units are integrated into one unit. The integrated unit may be implemented in a form of hardware, or may be implemented in a form of a software functional unit.

When the integrated unit is implemented in the form of a software functional unit and sold or used as an independent product, the integrated unit may be stored in a computer-readable storage medium. Based on such an understanding, the technical solutions of the present disclosure essentially, or the part contributing to the prior art, or all or some of the technical solutions may be implemented in the form of a software product. The software product is stored in a storage medium and includes several instructions for instructing a computer device (which may be a personal computer, a server, or a network device) to perform all or some of the steps of the methods described in the embodiments of the present disclosure. The foregoing storage medium includes any medium that may store program code, such as a USB flash drive, a removable hard disk, a read-only memory (ROM), a random-access memory (RAM), a magnetic disk, or an optical disc.

The foregoing provides detailed descriptions about the storage unit, the memory, and the method for controlling a storage unit that are provided in the present disclosure. Based on the idea of the embodiments of the present disclosure, a person of ordinary skill in the art may make modifications with respect to the specific implementation manners and the application scope. Therefore, the content of this specification shall not be construed as a limitation to the present disclosure.

What is claimed is:

1. A storage device comprising:
a comb-shaped magnetic track;
a first drive circuit;
a second drive circuit;
a first drive port connected to the first drive circuit;
a second drive port connected to the second drive circuit;
a write circuit connected to a bottom of the comb-shaped magnetic track and configured to perform a write operation; and
a read circuit connected to the bottom of the comb-shaped magnetic track and configured to perform a read operation,
wherein the comb-shaped magnetic track comprises:
a first storage area;
a second storage area; and
a comb handle connected to the first storage area and the second storage area,
wherein at least one storage area of the first storage area and the second storage area comprises at least two memory bars,
wherein the first drive circuit is configured to drive the first storage area,
wherein the second drive circuit is configured to drive the second storage area,
wherein a first magnetic domain wall in a first memory bar in the first storage area is configured to move by controlling input voltages of a first port, a second port, the first drive port, and the second drive port and driving the first drive circuit to generate a first current pulse in the first memory bar, and
wherein a second magnetic domain wall in a second memory bar in the second storage area is configured to move by controlling the input voltages of the first port, the second port, the first drive port, and the second drive port and driving the second drive circuit to generate a second current pulse in the second memory bar.

2. The storage device according to claim 1, wherein the first drive circuit comprises a first gate port, wherein the second drive circuit comprises a second gate port, wherein the first gate port is configured to control, according to a first value of a first voltage applied to the first gate port, to switch on or off the first drive circuit, and wherein the second gate port is configured to control, according to a second value of a second voltage applied to the second gate port, to switch on or off the second drive circuit.

3. The storage device according to claim 1, wherein the first storage area is disposed between the first port and the comb handle, and wherein the second storage area is disposed between the second port and the comb handle.

4. The storage device according to claim 1, wherein the write circuit is configured to perform a write operation on a third memory bar in the first storage area or the second storage area, and wherein the read circuit is configured to perform a read operation on the third memory bar.

5. The storage device according to claim 4, wherein the storage device further comprises a storage module connected to the read circuit, and wherein the storage module is configured to store data read out from the comb-shaped magnetic track when a third magnetic domain wall in the third memory bar in the comb-shaped magnetic track moves.

6. A memory comprising at least one storage device, wherein the storage device comprises:
a comb-shaped magnetic track;
a first drive circuit;
a second drive circuit;
a first drive port connected to the first drive circuit;
a second drive port connected to the second drive circuit;
a write circuit connected to a bottom of the comb-shaped magnetic track and configured to perform a write operation; and
a read circuit connected to the bottom of the comb-shaped magnetic track and configured to perform a read operation,
wherein the comb-shaped magnetic track comprises:
a first storage area;
a second storage area; and
a comb handle connected to the first storage area and the second storage area,
wherein at least one storage area of the first storage area and the second storage area comprises at least two memory bars,
wherein the first drive circuit is configured to drive the first storage area,
wherein the second drive circuit is configured to drive the second storage area, wherein a first magnetic domain wall in a first memory bar in the first storage area is configured to move by controlling input voltages of a first port, a second port, the first drive port, and the second drive port and driving the first drive circuit to a first current pulse is generated in the first memory bar, and
wherein a second magnetic domain wall in a second memory bar in the second storage area is configured to move by controlling the input voltages of the first port, the second port, the first drive port, and the second drive port and driving the second drive circuit to generate a second current pulse in the second memory bar.

7. The memory according to claim 6, wherein the first drive circuit comprises a first gate port, wherein the second drive circuit comprises a second gate port, wherein the first gate port is configured to control, according to a first value of a first voltage applied to the first gate port, to switch on or of the first drive circuit, and wherein the second gate port is configured to control, according to a second value of a second voltage applied to the second gate port, to switch on or off the second drive circuit.

8. The memory according to claim 6, wherein the first storage area is disposed between the first port and the comb handle, and wherein the second storage area is disposed between the second port and the comb handle.

9. The memory according to claim 6, wherein the write circuit is configured to perform a write operation on a third memory bar in the first storage area or the second storage area, and wherein the read circuit is configured to perform a read operation on the third memory bar.

10. The memory according to claim 9, wherein the storage device further comprises a storage module connected to the read circuit, and wherein the storage module is configured to store data read out from the comb-shaped magnetic track when a magnetic domain wall in the third memory bar in the comb-shaped magnetic track moves.

11. A method for controlling a storage device, wherein the storage device comprises a comb-shaped magnetic track, a read circuit connected to a bottom of the comb-shaped magnetic track, a write circuit connected to the bottom of the comb-shaped magnetic track, a first drive circuit, a second drive circuit, a first drive port connected to the first drive circuit, and a second drive port connected to the second drive circuit, wherein the comb-shaped magnetic track comprises a first storage area, a second storage area, and a comb handle connected to the first storage area and the second storage area, wherein at least one storage area of the first storage area and the second storage area comprises at least two memory bars, wherein the first storage area is disposed between a first port and the comb handle, wherein the second storage area is disposed between a second port and the comb handle, and wherein the method comprises:

controlling input voltages of the first port, the second port, the first drive port, and the second drive port and driving the first drive circuit to generate a first current pulse in a first memory bar in the first storage area;

driving a first magnetic domain wall in the first memory bar in which the first current puke is generated to move; and controlling the input voltages of the first port, the second port, the first drive port, and the second drive port and driving the second drive circuit to generate a second current pulse in a second memory bar in the second storage area of the storage device; and driving a second magnetic domain wall in the second memory bar in which the second current puke is generated to move.

12. The method according to claim 11, wherein the first drive circuit comprises a first gate port, wherein the second drive circuit comprises a second gate port, and wherein the method further comprises conducting the first drive circuit according to values of input voltages of the first gate port and the second gate port.

13. The method according to claim 11, wherein the first drive circuit comprises a first gate port, wherein the second drive circuit comprises a second gate port, and wherein the method further comprises conducting the second drive circuit according to values of input voltages of the first gate port and the second gate port.

14. The method according to claim 11, wherein the write circuit is configured to perform a write operation on a third memory bar in the first storage area or the second storage area, and the read circuit is configured to perform a read operation on the third memory bar.

* * * * *

UNITED STATES PATENT AND TRADEMARK OFFICE
CERTIFICATE OF CORRECTION

PATENT NO.         : 9,653,178 B2
APPLICATION NO.    : 15/133452
DATED              : May 16, 2017
INVENTOR(S)        : Yinyin Lin et al.

It is certified that error appears in the above-identified patent and that said Letters Patent is hereby corrected as shown below:

In the Claims

Column 16, Lines 6 and 15, Claim 11 should read:

A method for controlling a storage device, wherein the storage device comprises a comb-shaped magnetic track, a read circuit connected to a bottom of the comb-shaped magnetic track, a write circuit connected to the bottom of the comb-shaped magnetic track, a first drive circuit, a second drive circuit, a first drive port connected to the first drive circuit, and a second drive port connected to the second drive circuit, wherein the comb-shaped magnetic track comprises a first storage area, a second storage area, and a comb handle connected to the first storage area and the second storage area, wherein at least one storage area of the first storage area and the second storage area comprises at least two memory bars, wherein the first storage area is disposed between a first port and the comb handle, wherein the second storage area is disposed between a second port and the comb handle, and wherein the method comprises:
controlling input voltages of the first port, the second port, the first drive port, and the second drive port and driving the first drive circuit to generate a first current pulse in a first memory bar in the first storage area:
driving a first magnetic domain wall in the first memory bar in which the first current pulse is generated to move; and
controlling the input voltages of the first port, the second port, the first drive port, and the second drive port and driving the second drive circuit to generate a second current pulse in a second memory bar in the second storage area of the storage device; and
driving a second magnetic domain wall in the second memory bar in which the second current pulse is generated to move.

Signed and Sealed this
Fourth Day of July, 2017

Joseph Matal
*Performing the Functions and Duties of the*
*Under Secretary of Commerce for Intellectual Property and*
*Director of the United States Patent and Trademark Office*